(12) United States Patent
Pasadyn et al.

(10) Patent No.: US 6,610,550 B1
(45) Date of Patent: Aug. 26, 2003

(54) METHOD AND APPARATUS FOR CORRELATING ERROR MODEL WITH DEFECT DATA

(75) Inventors: Alexander J. Pasadyn, Austin, TX (US); Christopher A. Bode, Austin, TX (US)

(73) Assignee: Advanced Micro Devices, Austin, TX (US)

( * ) Notice: Subject to any disclaimer, the term of this patent is extended or adjusted under 35 U.S.C. 154(b) by 0 days.

(21) Appl. No.: 10/114,782

(22) Filed: Apr. 3, 2002

(51) Int. Cl.[7] .............................................. H01L 21/66
(52) U.S. Cl. ......................................... 438/14; 438/15
(58) Field of Search ............................. 438/14, 15, 16, 438/17; 700/121, 110

(56) References Cited

U.S. PATENT DOCUMENTS

| | | | | |
|---|---|---|---|---|
| 3,751,647 A | * | 8/1973 | Maeder et al. ................. | 438/14 |
| 4,637,123 A | * | 1/1987 | Cazcarra et al. ... | 148/DIG. 127 |
| 4,668,330 A | * | 5/1987 | Golden ........................ | 118/664 |
| 6,184,048 B1 | * | 2/2001 | Ramon ........................ | 324/522 |
| 6,210,983 B1 | * | 4/2001 | Atchison et al. ............... | 438/14 |
| 6,289,257 B1 | * | 9/2001 | Sekine ......................... | 438/14 |
| 6,311,139 B1 | * | 10/2001 | Kuroda et al. ................. | 438/14 |
| 6,337,218 B1 | * | 1/2002 | Uzoh et al. .................. | 257/780 |

\* cited by examiner

*Primary Examiner*—John F. Niebling
*Assistant Examiner*—Olivia Luk
(74) *Attorney, Agent, or Firm*—Williams, Morgan & Amerson, P.C.

(57) ABSTRACT

A method and an apparatus for correlating error data with detect data. A semiconductor wafer in a first lot is processed. Defect data based upon analysis of the processed semiconductor wafer is acquired. Electrical test data based upon analysis of the processed semiconductor wafer is acquired. The electrical test data is acquired by performing a wafer electrical testing process on the processed semiconductor wafer. The electrical test data is correlated with the defect data to produce correlated data. At least one of the following is performed: a yield prediction or the performance prediction of a second lot based upon the correlated data. The yield prediction comprises predicting a percentage yield of acceptable semiconductor wafers in the second lot. The performance prediction comprises predicting the performance of the acceptable semiconductor wafers.

9 Claims, 7 Drawing Sheets

METHOD AND APPARATUS FOR CORRELATING ERROR MODEL WITH DEFECT DATA

BACKGROUND OF THE INVENTION

1. Field of the Invention

This invention relates generally to semiconductor manufacturing, and, more particularly, to a method and apparatus for correlating error data with defect data.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in the formation of various features or objects in the process layer. Such features may be used for a gate electrode structure for transistors. Many times, trench isolation structures are also formed on the substrate of the semiconductor wafer to isolate electrical areas on a semiconductor wafer. One example of an isolation structure that can be used is a shallow trench isolation (STI) structure. Typically, STI structures are formed on the semiconductor wafers by forming trenches in the wafer and filling such trenches with an insulating material, such as silicon dioxide.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed above one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a flowchart depiction of a typical process flow is illustrated. A manufacturing lot of semiconductor wafers 105 are processed (block 210). Upon completion of the processing of the lot of semiconductor wafers 105, defect data is collected for analysis (block 220). The manufacturing control system that performs the semiconductor wafer processing determines the severity of the defects. Based upon the defect data, certain semiconductor wafers 105 and/or the entire lot of semiconductor wafers 105 that have significant defects may be scrapped (block 230). Additionally, electrical testing of the semiconductor wafers 105 may also be performed (block 240). The system also determines the probable amount of errors on the processed semiconductor wafer 105 that may occur based upon results from the electrical testing. As a result, a certain amount of semiconductor wafers 105 may also be scrapped due to the existence of unacceptable electrical faults (block 250).

Problems associated with the current methodology include processing of unnecessary semiconductor wafers 105 due to a lack of predictability of the performance/yield of the semiconductor wafers 105. Often, an entire lot, or a significant number of semiconductor wafers 105 in a lot, may be processed before they are rejected due to defects and/or performance problems detected by electrical testing. Additionally, a lack of predictability as to the yield of a lot of semiconductor wafers 105 may cause an undesirable completion of processing of the lot, which otherwise may have been terminated. Furthermore, manufacturing planning may become difficult due to a lack of a more efficient and accurate prediction of performance and/or yield of processed semiconductor wafers.

The present invention is directed to overcoming, or at least reducing, the effects of, one or more of the problems set forth above.

SUMMARY OF THE INVENTION

In one aspect of the present invention, a method is provided for correlating error data with detect data. A semiconductor wafer in a first lot is processed. Defect data based upon analysis of the processed semiconductor wafer is acquired. Electrical test data based upon analysis of the processed semiconductor wafer is acquired. The electrical test data is acquired by performing a wafer electrical testing process on the processed semiconductor wafer. The electrical test data is correlated with the defect data to produce correlated data. At least one of the following is performed: a yield prediction or the performance prediction of a second lot based upon the correlated data. The yield prediction comprises predicting a percentage yield of acceptable semiconductor wafers in the second lot. The performance prediction comprises predicting the performance of the acceptable semiconductor wafers.

In another aspect of the present invention, a system is provided for correlating error data with detect data. The system of the present invention comprises: a process controller adapted to control processing of a lot of semiconductor wafers; a wafer electrical testing unit operatively coupled to the process controller, the wafer electrical testing unit adapted to acquire electrical test data relating to the processed semiconductor wafers; a wafer defect detection unit operatively coupled to the process controller, the wafer detection unit adapted to acquire defect data relating to the processed semiconductor wafers; a defect density model operatively coupled to the wafer defect detection unit, the defect density model adapted to model the defects in the lot; and a yield/performance model operatively coupled to the defect density model, the yield/performance model to quantify at least one of a predicted yield and a predicted performance of semiconductor wafers in the lot.

In yet another aspect of the present invention, a computer readable program storage device encoded with instructions is provided for correlating error data with detect data. The computer readable program storage device encoded with instructions when executed by a computer: processes a semiconductor wafer in a first lot; acquires defect data based upon analysis of the processed semiconductor wafer; acquires electrical test data based upon analysis of the processed semiconductor wafer, electrical test data acquired by performing a wafer electrical testing process on the processed semiconductor wafer; correlates the electrical test data with the defect data to produce correlated data; and performs a yield prediction or a performance prediction of a second lot based upon the correlated data. The yield prediction comprises predicting a percentage yield of acceptable semiconductor wafers in the second lot. The performance prediction comprises predicting the performance of the acceptable semiconductor wafers.

BRIEF DESCRIPTION OF THE DRAWINGS

The invention may be understood by reference to the following description taken in conjunction with the accompanying drawings, in which like reference numerals identify like elements, and in which.

Figure 1:
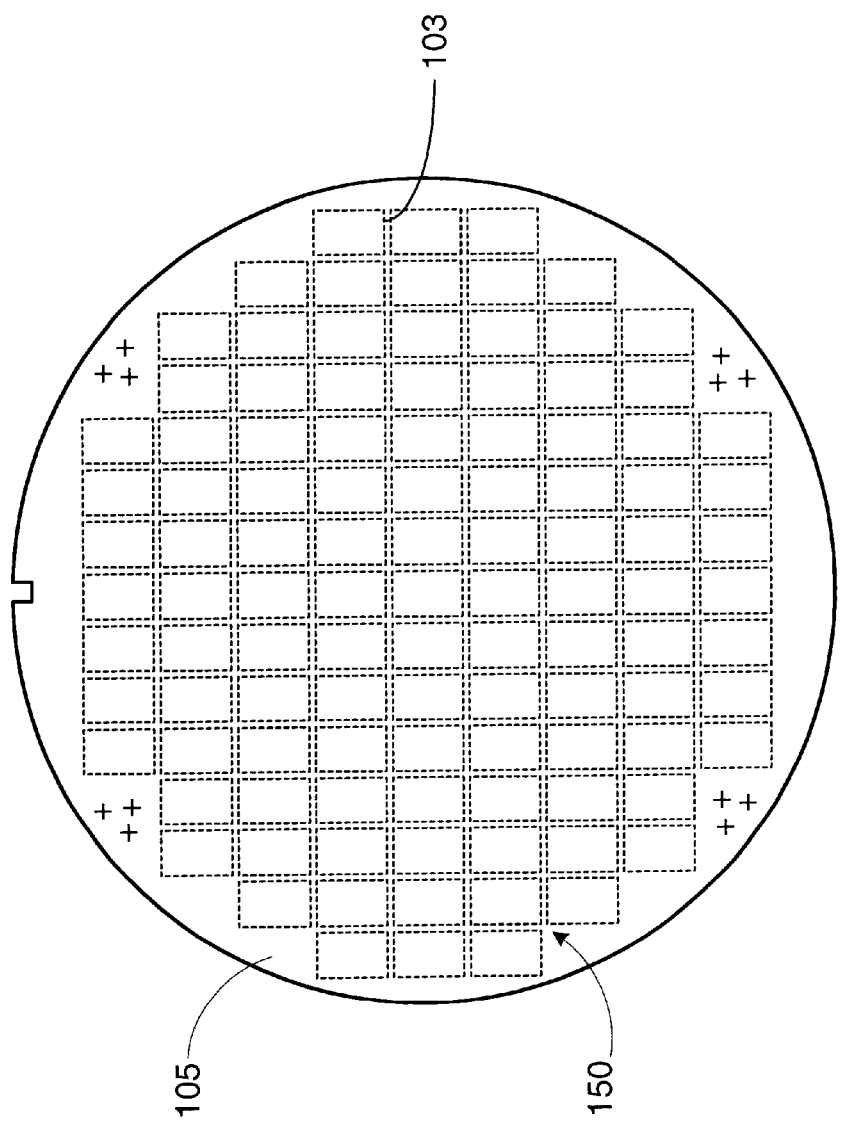
FIG. 1 is a simplified diagram of a prior art semiconductor wafer being processed.
Figure 2:
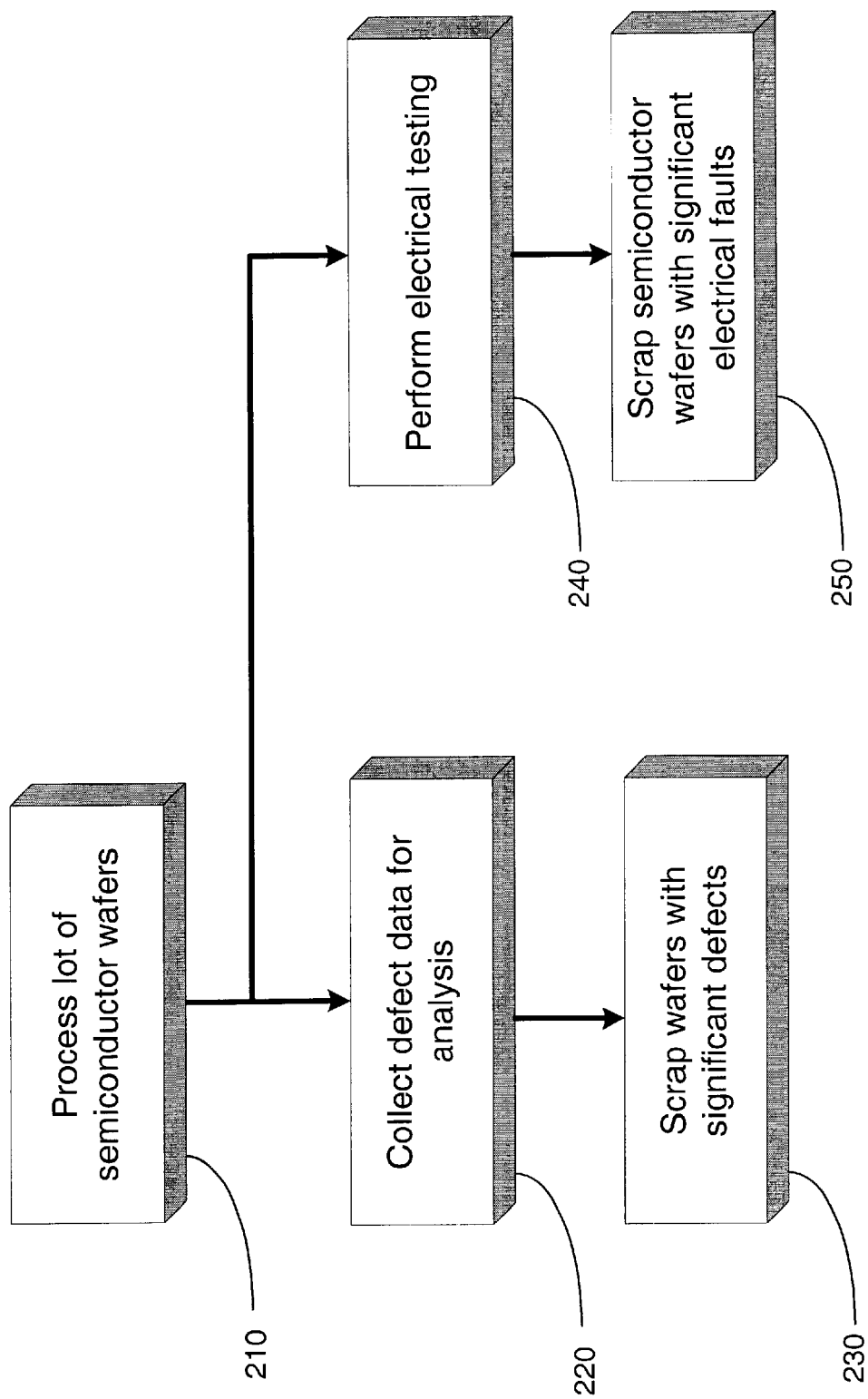
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, prediction of yield and/or performance of the semiconductor wafers 105 being processed is useful in developing manufacturing strategies. Embodiments of the present invention provide for performing a yield and/or performance prediction for quantifying the viability of particular semiconductor wafers 105. Using embodiments of the present invention, defective semiconductor wafers 105 may be scrapped at an earlier stage in the processing, resulting in significant savings and efficiency of semiconductor wafer 105 production. Embodiments of the present invention provide for acquiring defect data and electrical test data to perform a correlation between the two, which provides a yield and performance quantification of semiconductor wafers 105. Using embodiments of the present invention, a more accurate prediction of the performance of semiconductor wafers 105 being processed may be performed for invoking corrective actions. Embodiments of the present invention provide for corrective actions based upon the yield and performance predictions, which includes scrapping particular semiconductor wafers 105 in a lot, scrapping an entire lot of semiconductor wafers 105, performing fault detection, and/or performing feed-forward compensation on subsequent processes performed on the semiconductor wafers 105 based upon the yield and performance predictions.

Figure 3:
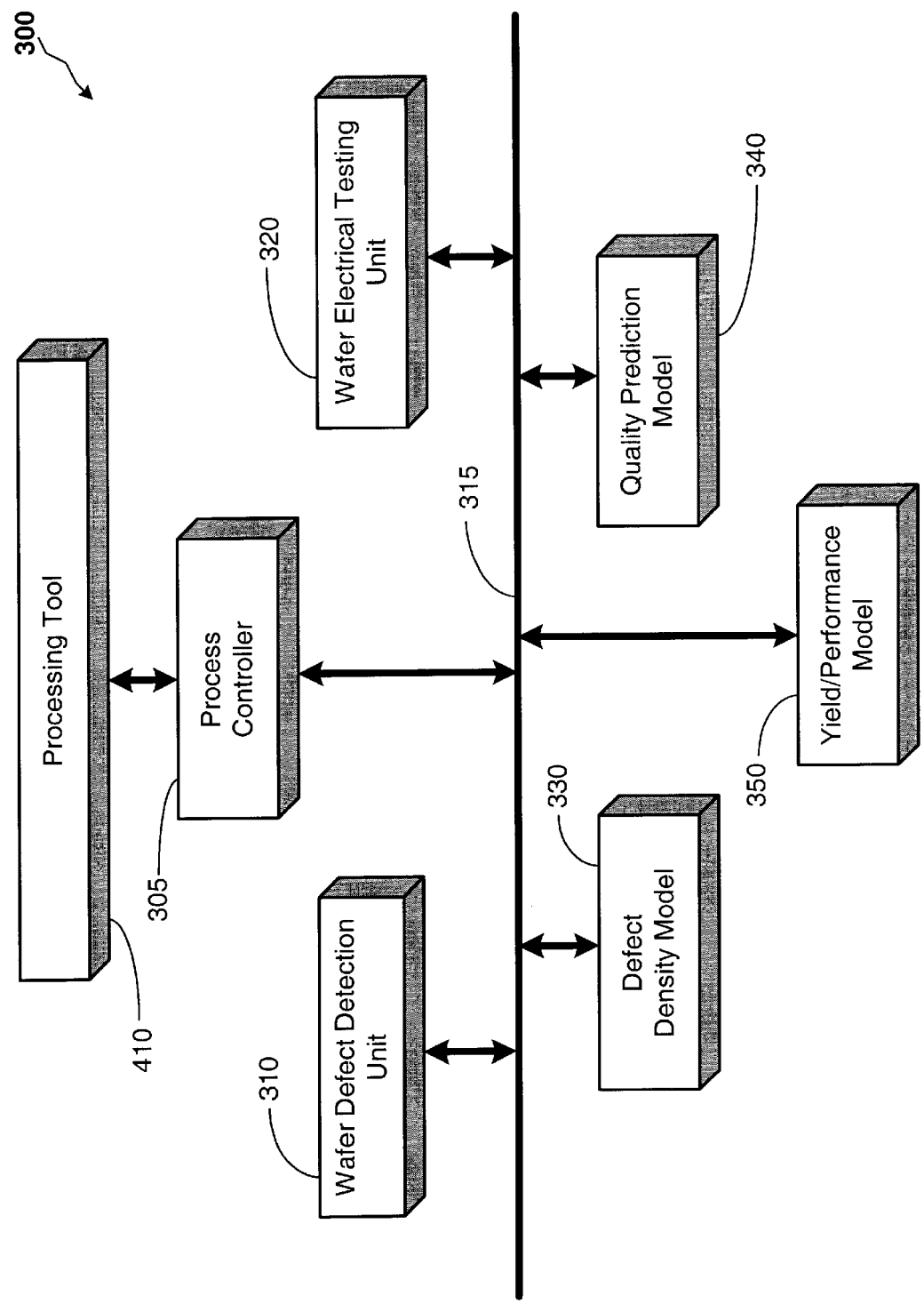
FIG. 3 is a block diagram representation of a system in accordance with one illustrative embodiment of the present invention.

Turning now to FIG. 3, the block diagram depiction of a system 300 for implementing embodiments of the present invention is illustrated. FIG. 3 illustrates a processing tool 410, a process controller 305, a wafer defect detection unit 310, a wafer electrical testing unit 320, a defect density model 330, a quality prediction model 340, and a yield/performance model 350, which communicate with each other via a system or network communications line 315. The system communications line 315 may be a computer bus link, a dedicated hardware communications link, a telephone system communications link, a wireless communications link, or other communication links that may be implemented by those skilled in the art having benefit of the present disclosure. The process controller 305 controls the operations of the processing tool 410, which processes a lot of semiconductor wafers 105. Once semiconductor wafers 105 are processed by the processing tool 410, defect data and electrical test data is acquired by the system 300. Generally, defects on the processed semiconductor wafers 105 may cause electrical faults in the semiconductor wafers 105, which may be detected by analyzing the electrical test data.

During and/or after processing a significant number of semiconductor wafers 105 in a lot, defect analysis may be performed on one or more processed semiconductor wafers 105. The system 300 may utilize one of a plurality of wafer defect detection units 310 to detect a number of defects on a semiconductor wafer 105. The defects detected may include contaminants in a semiconductor wafer 105, structures/formations on the semiconductor wafer 105 that have incorrect measurements, and the like. The defects data may be acquired using a metrology tool (discussed below). The wafer defect detection unit 310 provides defect data relating to particular semiconductor wafers 105 to the system 300. The defect data may be actual quantification of data recovered from processed semiconductor wafers 105 or representative/sampled data. The system 300 also performs electrical testing using the wafer electrical testing unit 320. The electrical testing includes intermediate electrical testing and final electrical testing (e.g., electrical tests performed once a semiconductor device is fabricated in the semiconductor wafer 105). Examples of factors analyzed using the data resulting from the electrical tests include drive current, chain resistivity, functional yield, sort yield, and the like.

The defect density model 330 models or predicts the likelihood of defects (number and/or type of defects) that may occur on particular semiconductor wafers 105. The defect density model 330 may be updated based upon the defect data received from the wafer defect detection unit 310. The quality prediction model 340 is capable of quantifying the level of quality on particular processed semiconductor wafers 105. The quality prediction model 340 is capable of quantifying the expected electrical results based upon the defect data, or some approximation. Result from the wafer electrical testing unit 320 and/or defect data may be used by the quality prediction model 340 to calculate a likelihood that particular semiconductor wafers 105 will be of a predicted or desired quality value. Based upon the defect density model 330 and the quality prediction model 340, the yield/performance model 350 provides a modeling of the percentage yield and/or the performance expected from a particular group of semiconductor wafers 105.

Figure 4:
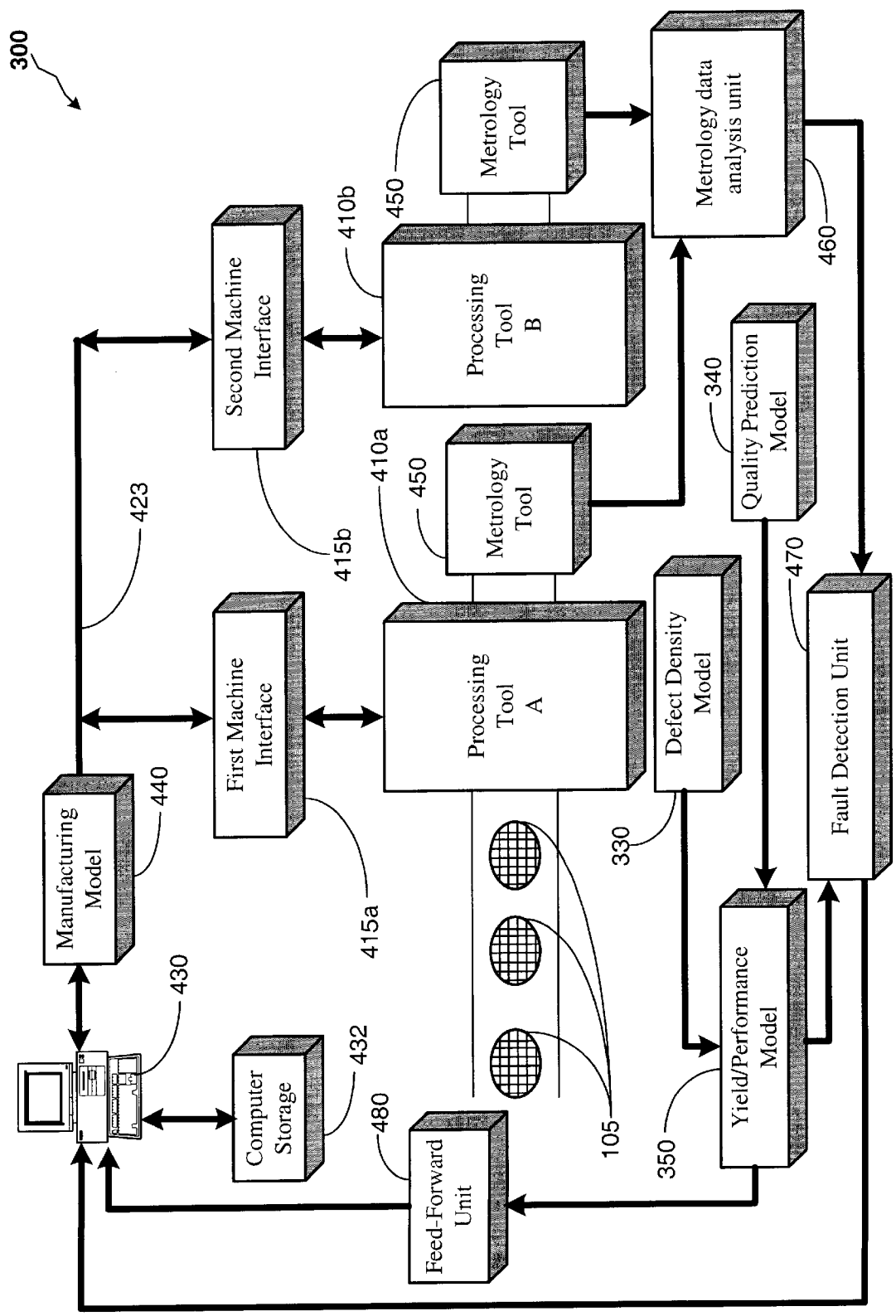
FIG. 4 illustrates a more detailed block diagram representation of the system shown in FIG. 3, in accordance with one illustrative embodiment of the present invention.

Turning now to FIG. 4, a more detailed block diagram of the system 300 in accordance with one embodiment of the present invention is illustrated. Semiconductor wafers 105 are processed on processing tools 410a, 410b using a plurality of control input signals, or manufacturing parameters, provided via a line or network 423. The control input signals, or manufacturing parameters, on the line 423 are sent to the processing tools 410a, 410b from a computer system 430 via machine interfaces 415a, 415b. The first and second machine interfaces 415a, 415b are generally located outside the processing tools 410a, 410b. In an alternative embodiment, the first and second machine interfaces 415a, 415b are located within the processing tools 410a, 410b. The semiconductor wafers 105 are provided to and carried from a plurality of processing tools 410. In one embodiment, semiconductor wafers 105 may be provided to a processing tool 410 manually. In an alternative embodiment, semiconductor wafers 105 may be provided to a processing tool 410 in an automatic fashion (e.g., robotic movement of semiconductor wafer 105). In one embodiment, a plurality of semiconductor wafers 105 is transported in lots (e.g., stacked in cassettes) to the processing tools 410.

In one embodiment, the computer system 430 sends control input signals, or manufacturing parameters, on the line 423 to the first and second machine interfaces 415a, 415b. The computer system 430 is capable of controlling processing operations. In one embodiment, the computer system 430 is a process controller. The computer system 430 is coupled to a computer storage unit 432 that may contain a plurality of software programs and data sets. The computer system 430 may contain one or more processors (not shown) that are capable of performing the operations described herein. The computer system 430 employs a manufacturing model 440 to generate control input signals on the line 423. In one embodiment, the manufacturing model 440 contains a manufacturing recipe that determines a plurality of control input parameters that are sent on the line 423 to the processing tools 410a, 410b.

In one embodiment, the manufacturing model 440 defines a process script and input control that implement a particular manufacturing process. The control input signals (or control input parameters) on the line 423 that are intended for processing tool A 410a are received and processed by the first machine interface 415a. The control input signals on the line 423 that are intended for processing tool B 410b are received and processed by the second machine interface 415b. Examples of the processing tools 410a, 410b used in semiconductor manufacturing processes are steppers, etch process tools, deposition tools, and the like.

One or more of the semiconductor wafers 105 that are processed by the processing tools 410a, 410b can also be sent to a metrology tool 450 for acquisition of metrology data. The metrology tool 450 may be a scatterometry data acquisition tool, an overlay-error measurement tool, a critical dimension measurement tool, and the like. In one embodiment, a metrology tool 450 examines one or more processed semiconductor wafers 105. The metrology data analysis unit 460 may collect, organize, and analyze data from the metrology tool 450. The metrology data is directed to a variety of physical or electrical characteristics of the devices formed on the semiconductor wafers 105. For example, metrology data may be obtained as to line width measurements, depth of trenches, sidewall angles, thickness, resistance, and the like.

The system 300 also comprises a fault detection unit 470 and a feed forward unit 480. The fault detection unit 470 may receive metrology data from the metrology data analysis unit 460 and data from the yield/performance model 350. Based upon the data received, the fault detection unit 470 may predict and/or determine an amount and/or type of fault that may occur during the processing of a lot of semiconductor wafers 105. Fault detection may be performed on each lot of semiconductor wafers 105. The results may then be used to characterize the performance of a lot that is being currently processed. Furthermore, based upon the fault detection unit 470, a feed forward unit 480 may provide corrective adjustments to subsequent processes performed on the semiconductor wafers 105 to compensate for the, predicted and/or existing errors. The feed forward unit 480 provides adjustment data to the computer system 430 to modify the manufacturing model 440, which in turn effects subsequent operation(s) performed by the processing tools 410.

In one embodiment, the metrology data analysis unit 460, the wafer defect detection unit 310, the wafer electrical testing unit 320, the defect density model 330, the quality prediction model 340, and/or the yield/performance model 350 are software or firmware components of a computer system that may be a standalone unit or may be integrated into the computer system 430.

Figure 5:
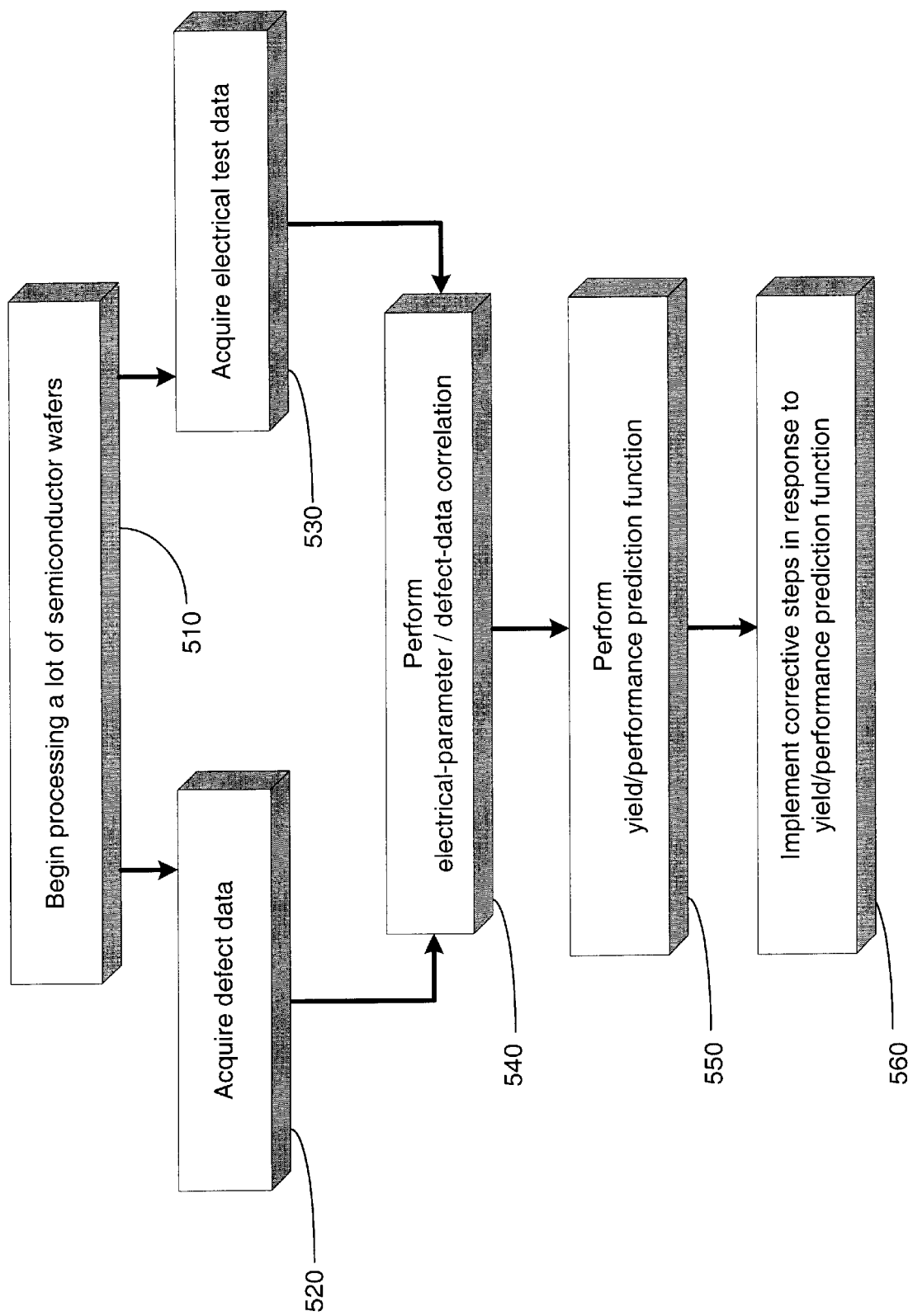
FIG. 5 illustrates a flowchart depiction of a method in accordance with one illustrative embodiment of the present invention.

Turning now to FIG. 5, a flow chart depiction of the methods for performing an embodiment of the present invention is illustrated. The system 300 begins processing a manufacturing lot/batch of semiconductor wafers 105 (block 510). During and/or after the processing of those semiconductor wafers 105, defect data is acquired by the system 300 (block 520). The system 300 may acquire defect data on one or more of the processed semiconductor wafers 105. The semiconductor wafers 105 may be sampled for defects. Furthermore, the system 300 may perform electrical testing on the processed semiconductor wafers 105 (block 530). The system 300 may perform intermediate electrical testing and/or final wafer electrical testing.

Using the defect data and the electrical test data, the system 300 performs an electrical parameter/defect data correlation function (block 540). The system correlates electrical parameter(s) data to corresponding defect data on selected semiconductor wafers 105 to produce correlated data. For example, a lack of electrical connection between two nodes on the semiconductor wafer 105 may be correlated to a break in a poly-line formed on the semiconductor wafer 105. Correlating particular electrical parameter(s) to certain (or all) defect(s) detected on the selected semiconductor wafers 105 may provide a more detailed analysis of the quality and performance of the processed semiconductor wafer 105.

Based on the correlation of the electrical testing data and the defect data, the system 300 then performs a yield/performance prediction process (block 550). The yield prediction process comprises predicting a percentage yield of acceptable semiconductor wafers in a lot. The performance prediction comprises predicting the performance of the acceptable semiconductor wafers in a lot. A more detailed illustration and description of the yield/performance prediction is provided in FIG. 6 and accompanying description below. The results from the yield/performance prediction indicated in block 550 provide a quantified prediction of the yield percentage and/or the performance prediction of the entire lot of semiconductor wafers 105. Subsequently, the system 300 then implements corrective action/steps in response to the yield/performance prediction in order to reduce the impact of the factors that led to the yield percentage and/or the performance prediction (block 560). A more detailed description and illustration of the corrective steps indicated in block 560 is provided in FIG. 7 and accompanying description below.

Figure 6:
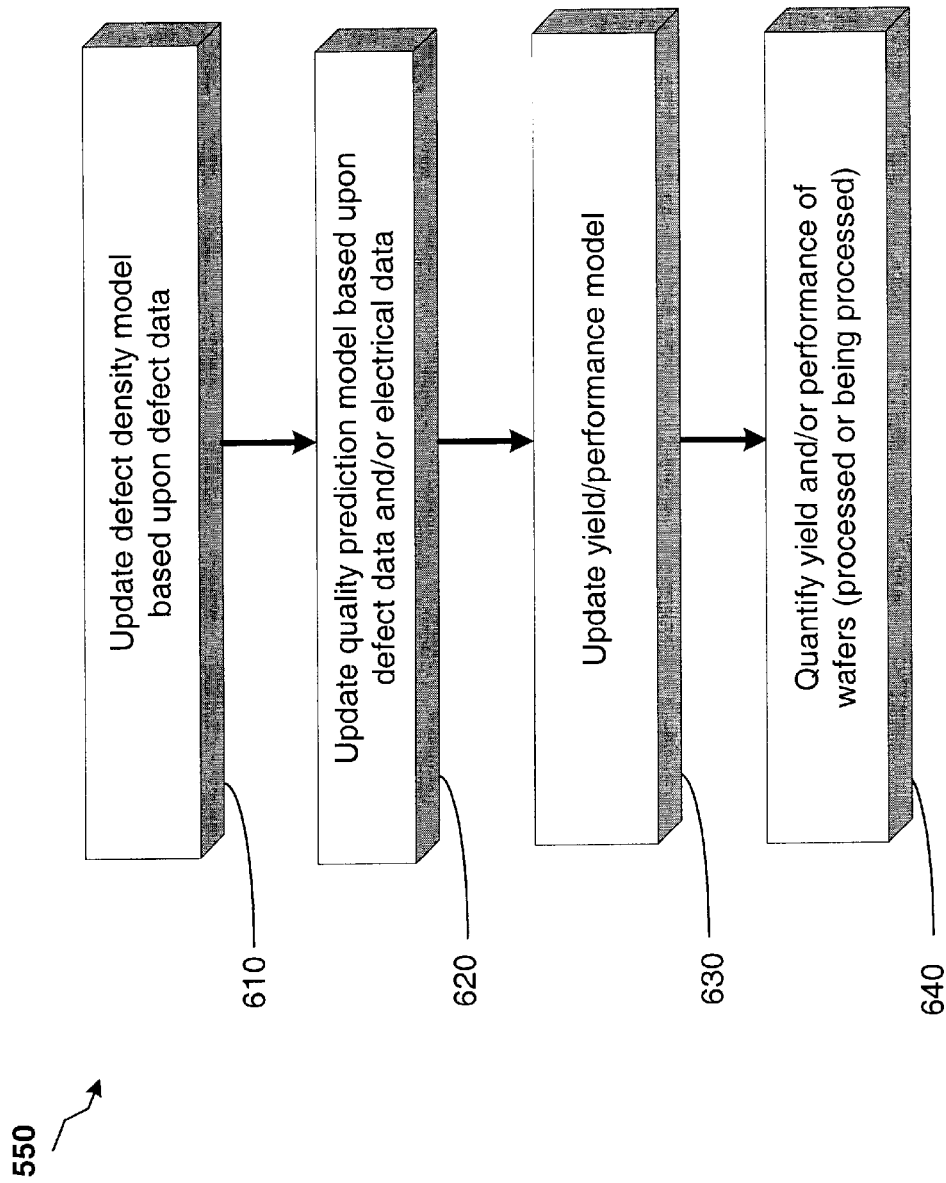
FIG. 6 illustrates a flowchart depiction of a method of performing a yield/performance prediction process, as indicated in FIG. 6, in accordance with one illustrative embodiment of the present invention.

Turning now to FIG. 6, a flow chart depiction of one embodiment of performing the yield/performance prediction indicated in block 550 of FIG. 5 is illustrated. The system 300 updates the defect density model 330 based upon the defect data (block 610). If the defect density model 330 does not exist, the system 300 creates one. The defect data is used to update the defect density model 330 to model the likelihood of defects and/or the number of defects in a lot/batch that may occur in the semiconductor wafers 105 being processed. Using newly acquired defect data, the defect density model 330 is updated to refine the prediction of the likelihood/number of defects. Subsequently, the system 300 updates the quality prediction model 340 based upon defect data and/or electrical test data (block 620).

Generally, based upon the electrical data, the performance of a device in a completed semiconductor wafer 105 may be predicted. For example, if a significant number of electrical shorts are detected during an electrical test performed on a semiconductor wafer 105, an assumption may be made that devices produced from that particular semiconductor wafer and/or set of semiconductor wafers are likely to be defective. The quality prediction model 340 is updated based upon newly acquired defect and/or electrical test data.

The updated defect density model 330 and the updated quality prediction model 340 are then used to update the yield/performance model 350 (block 630). The yield/performance model 350 provides a prediction of upcoming yield and/or performance of semiconductor wafers 105 that are being processed or are to be processed. Subsequently, the system 300 quantifies the yield and/or performance of processed semiconductor wafers 105 or semiconductor wafers that are being processed (block 640). Quantifying the yield and/or performance includes using the yield/performance model 350 generated from a first lot of processed semiconductor wafer 105 to predict the yield/performance of a second lot of semiconductor wafers 105 based upon the defect detected in the second lot of semiconductor wafers 105. Using the quantified yield/performance prediction, the system 300 may determine whether to invoke corrective actions or scrap at least a portion of a lot/batch of semiconductor wafers 105. The completion of the steps indicated in FIG. 6 substantially completes the process of performing the yield performance prediction indicated in block 550 of FIG. 5.

Figure 7:
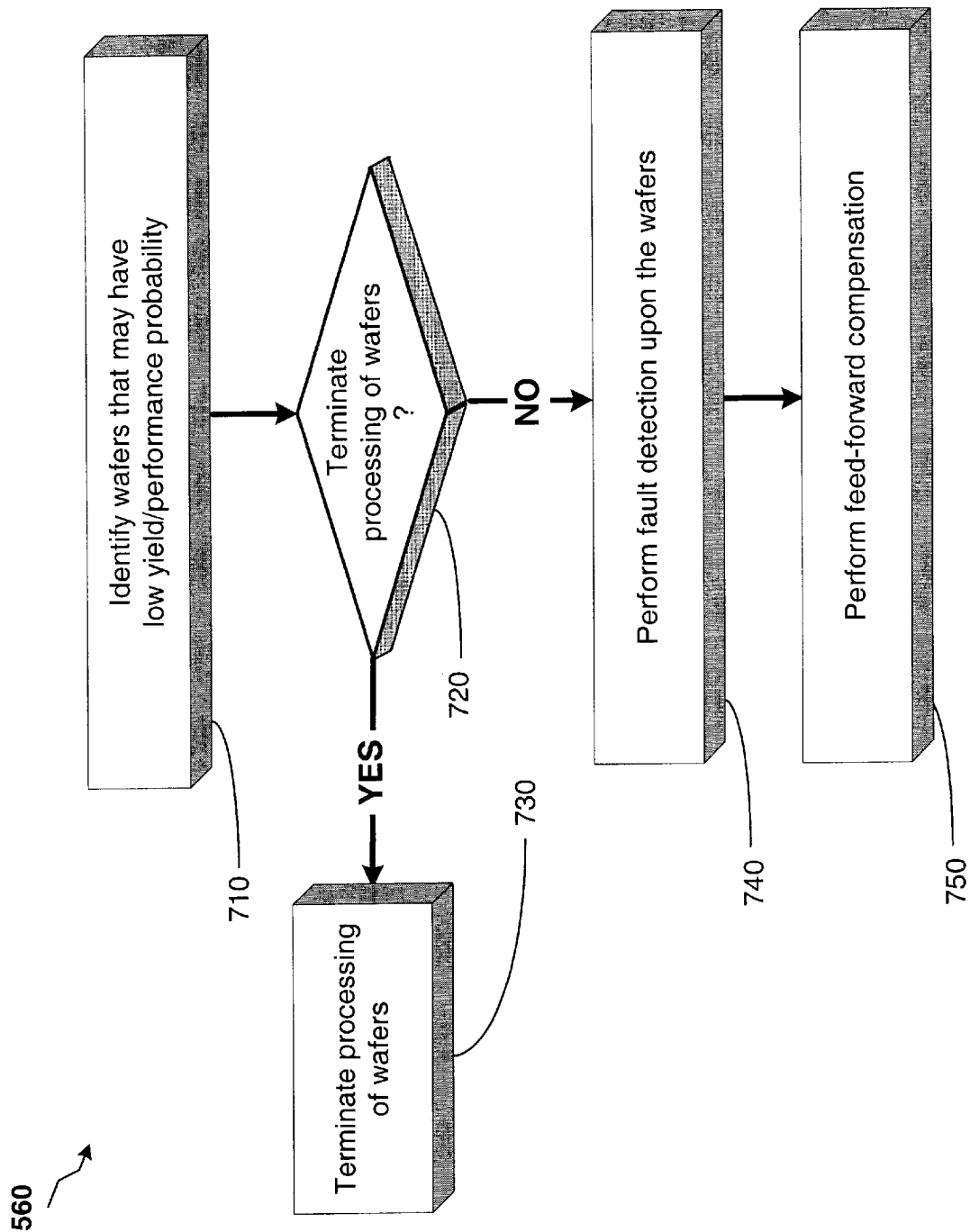
FIG. 7 illustrates a flowchart depiction of a method of implementing corrective steps in response to the yield/performance prediction process, as indicated in FIG. 6, in accordance with one illustrative embodiment of the present invention.

Turning now to FIG. 7, a flow chart depiction of one embodiment of performing or implementing the corrective steps in response to the yield/performance prediction, as indicated in block 560 of FIG. 5, is illustrated. The system 300 identifies one or more semiconductor wafers 105 that have been predicted to have low yield and/or performance probability (block 710). Generally, the yield/performance probability calculations are performed for a group of semiconductor wafers 105 within a lot. If yield/performance probability calculations are performed on selected semiconductor wafers 105 in a lot, then a statistical extrapolation is made to calculate a representative yield/performance probability for the entire lot.

The system 300 then determines whether to terminate processing of the semiconductor wafers 105 based on the yield/performance probabilities (block 720). The determination to terminate processing of the semiconductor wafers 105 is generally made if the yield/performance probability is very low, such that completing the processing of the semiconductor wafers 105 may not be cost effective. One or more business rules, such as profitability of a particular device created from the processed semiconductor wafers 105, and the like, may be used to make a determination whether to scrap the lot. If a decision to terminate the processing of the semiconductor wafers 105 is made, the selected semiconductor wafers 105 are then scrapped and the processing of the semiconductor wafers 105 is terminated (block 730).

If a determination is made not to terminate processing of the semiconductor wafers 105, the system 300 may then perform a fault detection process upon the semiconductor wafers 105 (block 740). The fault detection process may include predicting the severity and/or the amount of faults that may occur on the semiconductor wafers 105. The fault detection process may also include performing a site-to-site electrical testing, which may reveal problem areas on a semiconductor wafer 105. In one embodiment, the fault detection may comprise making a determination that certain semiconductor wafers 105 may contain an area, such as the inner portion of the semiconductor wafer 105, where it is predicted that the yield and the performance levels may be high, or vice versa. Therefore, those semiconductor wafers 105 may only be processed in certain regions. Other actions may be included in the fault detection process, such as corrective actions based upon metrology data and/or correcting certain tool parameters, such as temperature, pressure and the like.

The system 300 may also perform a feed-forward compensation process on the semiconductor wafers 105 to compensate or reduce the effects of defects that were detected (block 750). The feed-forward compensation process may be performed based on data generated from the fault detection analysis. Certain adjustments to subsequent processes may be made to overcome the predicted performance and/or yield issues determined by the system 300. The completion of the steps indicated in FIG. 7 substantially completes the process of implementing corrective steps in response to the yield/performance prediction as indicated in block 560 of FIG. 5. Using embodiments of the present invention, a more accurate prediction and response to probable defects may be performed. Furthermore, a determination may be made to scrap a portion of a lot/batch of semiconductor wafers 105 based on implementation of embodiments of the present invention, leading to more efficient and cost-effective manufacturing of semiconductor wafers 105.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a semiconductor wafer in a first lot;
   acquiring defect data based upon analysis of said processed semiconductor wafer;
   acquiring electrical test data based upon analysis of said processed semiconductor wafer, said electrical test data being acquired by performing a wafer electrical testing process on said processed semiconductor wafer;
   correlating said electrical test data with said defect data to produce correlated data; and
   performing a yield prediction and a performance prediction of a second lot based upon said correlated data, said yield prediction comprising predicting a percentage yield of acceptable semiconductor wafers in said second lot and said performance prediction comprising predicting the performance of said acceptable semiconductor wafers in said second lot.

2. The method described in claim 1, further comprising implementing at least one corrective action in response to at least one of said yield prediction and said performance prediction.

3. The method described in claim 2, wherein implementing said corrective action further comprises performing a feed-forward process to perform adjustments to said semiconductor wafer in said lot in response to at least one of said yield prediction and said performance prediction.

4. The method described in claim 2, wherein implementing said corrective action further comprises scrapping at least one semiconductor wafer in said lot response to at least one of said yield prediction and said performance prediction.

5. The method described in claim 2, wherein implementing said corrective action further comprises:
   determining whether to terminate processing of said semiconductor wafer based upon at least one of said yield prediction and said performance prediction;
   performing a fault detection upon said semiconductor wafer based upon a to determination to not terminate processing said semiconductor wafer; and
   performing a feed-forward compensation based upon said fault detection to reduce an impact of a fault detected in response to performing said fault detection.

6. The method described in claim 1, wherein acquiring defect data based upon analysis of said processed semiconductor wafer comprises:
   acquiring metrology data relating to said processed semiconductor wafer; and
   analyzing said metrology data to determine if said processed semiconductor wafers contains a defect to generate defect data.

7. The method described in claim 1, wherein correlating said electrical parameter with said defect data to produce correlated data further comprises determining whether a defect detected on said processed semiconductor wafer corresponds to a result from said wafer electrical test.

8. The method described in claim 1, wherein performing said yield prediction further comprises:
   providing a defect density model to model the defects relating to said first lot;
   updating said defect density model in response to detecting a defect on said processed semiconductor wafer;
   providing a yield model to model the predicted yield for said first lot;

updating said yield model in response to said updating of said defect density model and said correlated data; and quantifying a predicted yield of said second lot based upon said yield model.

9. The method described in claim 1, wherein performing said yield prediction further comprises:

providing a defect density model to model the defects relating to said first lot;

updating said defect density model in response to detecting a defect on said processed semiconductor wafer;

providing a performance model to model the predicted performance for said first lot;

updating said performance model in response to said updating of said defect density model and said correlated data; and quantifying a predicted performance of said second lot based upon said performance model.

* * * * *

UNITED STATES PATENT AND TRADEMARK OFFICE
CERTIFICATE OF CORRECTION

PATENT NO.     : 6,610,550 B1                                          Page 1 of 1
DATED          : August 26, 2003
INVENTOR(S)    : Alexander J. Pasadyn and Christopher A. Bode It is certified that error appears in the above-identified patent and that said Letters Patent is hereby corrected as shown below:

<u>Column 10,</u>
Line 15, replace "and" with -- in combination with --.
Line 41, delete "a to" replace with -- a --.

Signed and Sealed this

Sixth Day of January, 2004

JAMES E. ROGAN
*Director of the United States Patent and Trademark Office*